(12) United States Patent
Luthra et al.

(10) Patent No.: US 9,230,616 B2
(45) Date of Patent: Jan. 5, 2016

(54) MEMORY DEVICES, MEMORY DEVICE OPERATIONAL METHODS, AND MEMORY DEVICE IMPLEMENTATION METHODS

(71) Applicant: Micron Technology, Inc., Boise, ID (US)

(72) Inventors: Yogesh Luthra, San Jose, CA (US); Makoto Kitagawa, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 14/151,704

(22) Filed: Jan. 9, 2014

(65) Prior Publication Data

US 2015/0194191 A1    Jul. 9, 2015

(51) Int. Cl.
*G11C 7/04* (2006.01)
*G01K 13/00* (2006.01)
*G11C 11/406* (2006.01)

(52) U.S. Cl.
CPC ........ *G11C 7/04* (2013.01); *G01K 13/00* (2013.01); *G11C 11/40626* (2013.01)

(58) Field of Classification Search
CPC ...... G11C 7/04; G11C 11/40626; G11C 7/22; G01K 13/00
USPC ................................. 365/191, 211, 222
See application file for complete search history.

(56) References Cited

U.S. PATENT DOCUMENTS

| | | | |
|---|---|---|---|
| 6,453,218 B1 * | 9/2002 | Vergis | G05D 23/2015 365/211 |
| 7,075,847 B2 * | 7/2006 | Kim et al. | 365/222 |
| 7,084,695 B2 | 8/2006 | Porter | |
| 7,292,488 B2 * | 11/2007 | Hokenmaier et al. | 365/212 |
| 7,310,013 B2 | 12/2007 | Porter | |
| 7,551,501 B2 * | 6/2009 | Kim et al. | 365/211 |
| 7,630,265 B2 | 12/2009 | Macerola et al. | |
| 7,889,575 B2 * | 2/2011 | Wang | G11C 5/143 365/189.07 |
| 2008/0137460 A1 * | 6/2008 | Incarnati et al. | 365/212 |

* cited by examiner

*Primary Examiner* — Tan Nguyen
(74) *Attorney, Agent, or Firm* — Wells St. John P.S.

(57) ABSTRACT

Memory devices, memory device operational methods, and memory device implementation methods are described. According to one arrangement, a memory device includes memory circuitry configured to store data in a plurality of different data states, temperature sensor circuitry configured to sense a temperature of the memory device and to generate an initial temperature output which is indicative of the temperature of the memory device, and conversion circuitry coupled with the temperature sensor circuitry and configured to convert the initial temperature output into a converted temperature output which is indicative of the temperature of the memory device at a selected one of a plurality of possible different temperature resolutions, and wherein the converted temperature output is utilized by the memory circuitry to implement at least one operation with respect to storage of the data.

36 Claims, 2 Drawing Sheets

MEMORY DEVICES, MEMORY DEVICE OPERATIONAL METHODS, AND MEMORY DEVICE IMPLEMENTATION METHODS

TECHNICAL FIELD

Embodiments disclosed herein pertain to memory devices, memory device operational methods, and memory device implementation methods.

BACKGROUND

Memory devices are widely used in varied electronic devices and are used in many different applications for storing digital data. Many different types of memory are available, each using a different fundamental technology for storing data, and the memory may be volatile or non-volatile memory. Resistive random-access memory (RRAM) including conductive-bridge random-access memory (CBRAM) and flash are examples of non-volatile memory.

Memory devices store data in a plurality of memory cells. The operation of the memory cells may be varied (e.g., cell current) dependent upon ambient temperature of the memory devices. In particular, some memory systems utilize semiconductive materials for data storage and the performance of these semiconductive materials may be affected by changes in temperature.

At least some embodiments are directed towards methods and apparatus for providing temperature information, for example, for use in implementing temperature compensation within memory systems in one illustrative embodiment.

DETAILED DESCRIPTION OF EXAMPLE EMBODIMENTS

At least some embodiments are directed towards methods and apparatus for providing temperature information which may be used with respect to data access and storage operations of memory systems. Some memory systems include temperature circuitry configured to provide temperature information which may be used by the memory systems to implement the data storage operations. In some embodiments, temperature circuitry which provides the temperature information may be programmed differently in different memory systems corresponding to use of the memory systems in different target applications in at least one embodiment. Example programming of the circuitry includes adjusting different temperature parameters of provided temperature information, such as temperature range and temperature resolution, and use of the temperature information by different temperature compensated circuits of the memory systems during operation. Additional details regarding example apparatus and methods for providing temperature information are discussed below in illustrative embodiments.

Figure 1:
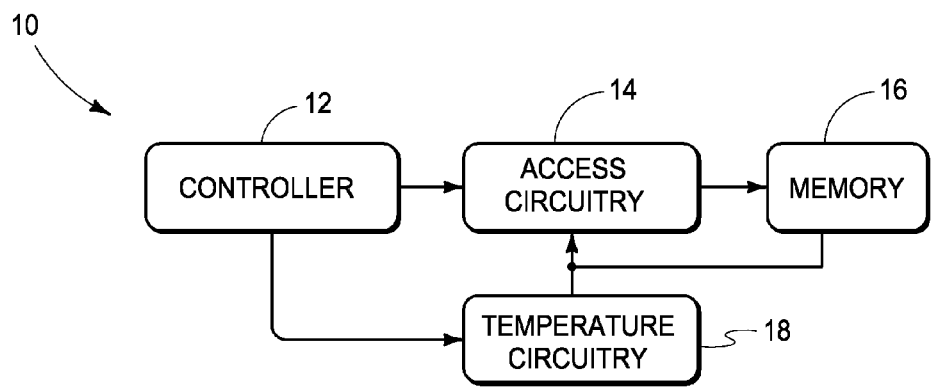
FIG. 1 is a functional block diagram of a memory system according to one embodiment.

Referring to FIG. 1, a functional block diagram of a memory system 10 is shown according to one embodiment. The illustrated memory system 10 includes a controller 12, access circuitry 14, memory 16 and temperature circuitry 18. Memory system 10 may be implemented within or with respect to various associated devices (not shown), such as computers, cameras, media players, automobiles, aircraft, in just a few illustrative examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more microcontroller, processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s).

In some embodiments, controller 12 includes a plurality of control bits (e.g., Tmin and resolution select control bits described below) which may be programmed differently to configure temperature circuitry 18 of the memory system 10 differently for use in different applications. As discussed with respect to example embodiments below, the control bits may be implemented as fuse bits which are utilized to program different temperature parameters, such as temperature range and resolution. These examples of controller 12 are for illustration and other configurations are possible.

Access circuitry 14 implements addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. The access circuitry 14 may apply electrical voltage potentials to the memory 16 to perform write, read and verification operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical characteristics, such as different resistances or capacitances corresponding to different memory states. In one specific example implementation, memory 16 is implemented as conductive-bridge random access memory (CBRAM) and the memory cells are conductive-bridge memory cells. However, this example is for illustration and the temperature sending apparatus and methods may be utilized in other memory storage technologies.

Memory 16 may be implemented in different arrangements in different embodiments. For example, the memory 16 may be implemented within a memory device, such as a chip, a portion of the chip (e.g., blocks, tiles, sub-tiles) or other arrangements. The memory device may also include controller 12, access circuitry 14 and temperature circuitry 18 or portions thereof.

Figure 2:
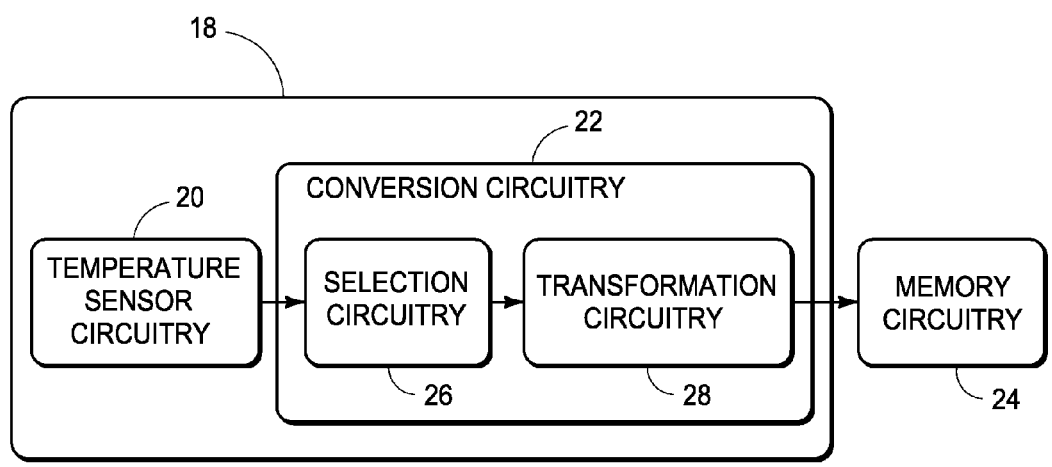
FIG. 2 is a functional block diagram illustrating details of temperature circuitry according to one embodiment.

Referring to FIG. 2, the illustrated example configuration of temperature circuitry 18 includes temperature sensor circuitry 20 and conversion circuitry 22 which provide temperature information to memory circuitry 24 which uses the temperature information to implement operations with respect to storage of data. Example operations discussed herein with respect to storage of data include operations directed towards writing data to memory as well as other operations, such as reading data from memory, verifying data in memory, and refreshing data in memory and may include voltage regulation of signals in one more specific example operation.

In one example embodiment, the memory circuitry 24 includes circuitry of the memory device other than temperature circuitry 18 and which is configured to implement operations with respect to programming, access, or retention of data and may include circuitry of one or more of controller 12, access circuitry 14 and memory 16. The memory circuitry 24 may include one or more portions having different temperature compensation requirements and temperature compensated circuits which adjust operations during operations in different ambient temperatures. In one more specific example, voltages of signals may be varied corresponding to changes in temperature.

The temperature circuitry 18 includes temperature sensor circuitry 20 and conversion circuitry 22 in one embodiment. Temperature sensor circuitry 20 is configured to sense a temperature of the memory system 10 and to generate an output comprising information indicative of the temperature of memory system 10 during operations of the memory system 10. The temperature sensor circuitry 20 varies an output as a result of changes in temperature of the memory system 10, and additional details regarding example temperature sensor circuitry 20 are discussed below with respect to FIG. 3. In one embodiment, the output of temperature sensor circuitry 20 is referred to as an initial temperature output comprising initial temperature information which is indicative of a temperature of memory system 10.

Conversion circuitry 22 converts the initial temperature information of the initial temperature output from temperature sensor circuitry 20 into a converted temperature output comprising converted temperature information in the described embodiment. The converted temperature information is provided in one or more different temperature ranges and/or resolutions in one embodiment. The converted temperature output and information may be utilized by memory circuitry 24 to implement at least one operation with respect to storage of data.

In one embodiment, the conversion circuitry 22 of different memory systems 20 may be programmed differently to implement different conversions of the temperature information for use in different target applications or environments (e.g., home, cellular, automotive, etc.) where the memory systems 10 may be subjected to different ranges of ambient temperatures.

The temperature circuitry 18 may be initially configured to provide temperature information within a first temperature range (e.g., −80° C. to 240° C.). However, it may be known that a given memory system 10 will only be used in environments of a smaller temperature range, and accordingly, the conversion circuitry 22 may be programmed to provide the converted temperature information within the corresponding smaller temperature range. In some embodiments described further below, the converted temperature information comprises information within one or more different temperature ranges and resolutions.

In one more specific embodiment, the resolution of temperature information may be increased corresponding to decreases in range of the temperature information. Accordingly, if a desired application of use of the memory system 10 will be within a temperature range which is less than the temperature range of the temperature sensor circuitry 20, then the temperature range of the temperature circuitry 18 may be reduced with the benefit of increased temperature resolution. Increased temperature resolution corresponds to a smaller unit of temperature measurement being indicated by a single bit (e.g., 5° C./bit) compared with a lower resolution which corresponds to a larger unit of temperature measurement being indicated by a single bit (e.g., 10° C./bit).

Conversion circuitry 22 includes selection circuitry 26 and transformation circuitry 28 in the illustrated embodiment. Selection circuitry 26 includes one or more multiplexers and transformation circuitry 28 includes one or more corresponding look-up-tables in the embodiment described below with respect FIG. 4. Selection circuitry 26 selects one or more different conversions of the initial temperature information to converted temperature information and the transformation circuitry 28 implements the selected conversions as described below in one embodiment. The selected conversions may be predefined and selected by programming in one embodiment.

Figure 3:
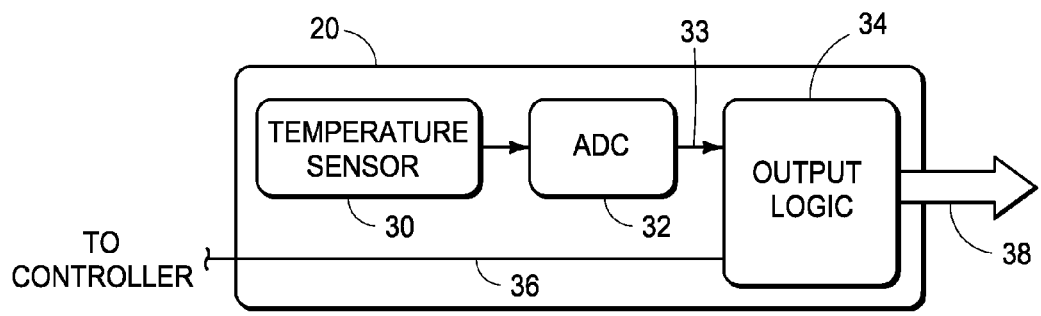
FIG. 3 is a functional block diagram of temperature sensor circuitry according to one embodiment.

Referring to FIG. 3, additional details regarding one example embodiment of temperature sensor circuitry 20 are described. The illustrated temperature sensor circuitry 20 includes a temperature sensor 30, an analog-to-digital converter (ADC) 32, output logic 34, a control bus 36 and an output bus 38.

Temperature sensor 30 is configured to output a voltage signal which is varied corresponding to different ambient temperatures of the memory system 10. The varied voltage signal is applied to ADC 32 which converts the signal into digital values corresponding to the different voltages and which are applied to output logic 34. Different parameters of temperature sensor 30 such as temperature range and resolution are dependent upon device variability and layout footprint.

Output logic 34 modifies the received digital values such that an output of the output logic 34 includes all digital 0's at the lowest temperature of the temperate range to be sensed. For example, if temperature information within the entire available temperature range of the temperature sensor 30 is desired for a given application (e.g., −80° C. to 240° C.), then the output logic 34 may be programmed to provide all digital 0's when the temperature of the memory system 10 is −80° C. However, if temperature information within a smaller range is desired for a different application (e.g., automobile application of −35° C. to 110° C. or mobile device application of −10° C. to 80° C.), then the output logic 34 may be programmed to provide all digital 0's when the temperature of the memory system 10 is at the lowest temperature of the appropriate temperature range. In one embodiment, the resolution of the temperature circuitry 18 is increased by use of a temperature range having an increased minimum temperature.

In one embodiment, following fabrication in an appropriate semiconductor fabrication process, the memory system 10 is placed in an environment which results in the memory system 10 having the lowest temperature of the temperature range and one or more control bits, referred to as Tmin fuse bits <M:0>, are programmed such that the output digital values of output logic 34 are at a lowest value (e.g., all digital 0's) at the lowest temperature. In one embodiment, output logic 34 subtracts the programmed Tmin fuse bits from the output of ADC 32 to provide the initial temperature information upon output bus 38 and which is converted by conversion circuitry 22 to a converted temperature output.

The output of ADC 32 is referred to as TempADC <N:0> and is applied via a bus 33 to output logic 34 and the Tmin fuse bits <M:0> are applied via a bus 36 to output logic 34. The output of output logic 34 upon output bus 38 is referred to as TempOut which is equal to TempADC <N:0>−Tmin fuse bits <M:0> as performed by output logic 34 in the described embodiment.

Output bus 38 is the output of temperature sensor circuitry 20 and communicates the initial temperature information in the form of a plurality of digital values to conversion circuitry 22. The outputted digital values comprise the initial temperature output or information indicative of the temperature of the memory system 10 in one embodiment. In some embodiments, the initial temperature output or information is over a relatively large temperature range corresponding to many different possible uses of the memory system 10, and which is only constrained by hardware limitations in one more specific embodiment.

Figure 4:
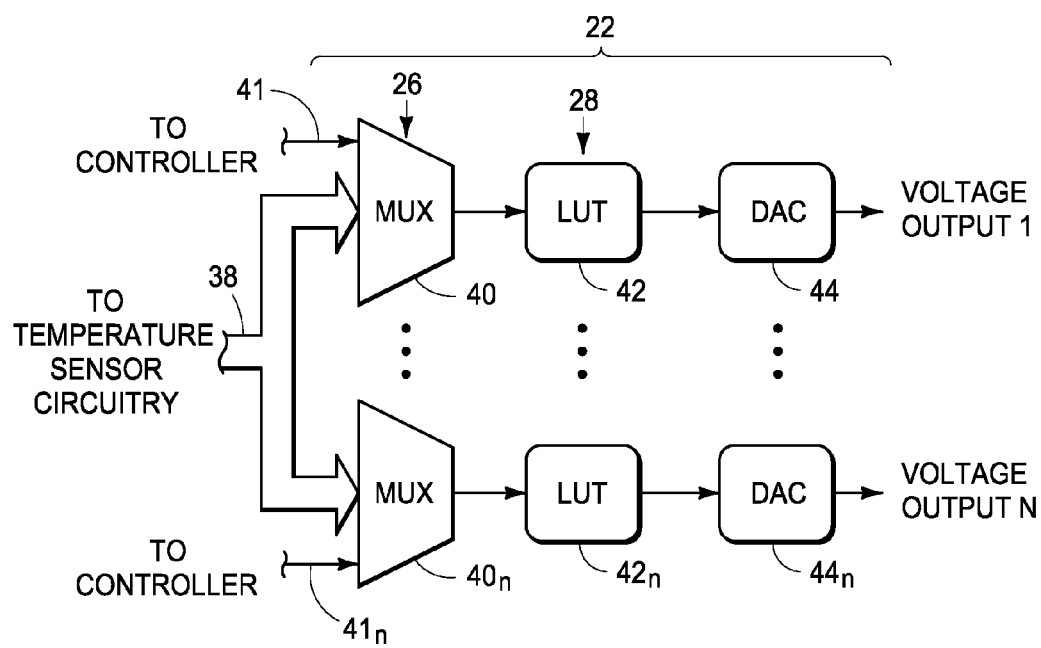
FIG. 4 is a functional block diagram of conversion circuitry according to one embodiment.

Referring to FIG. 4, example operations of conversion circuitry 22 to provide converted temperature information with different temperature ranges and resolutions are described according to one embodiment. Selection circuitry 26 selects one or more different conversions of the initial temperature information to converted temperature information and the transformation circuitry 28 implements the selected conversions as described below in one embodiment.

In the illustrated example arrangement, selection circuitry 26 of is implemented as one or more multiplexers 40-40n and transformation circuitry 28 is implemented as one or more look-up-tables (LUTs) 42-42n. In some embodiments, only one of the multiplexers 40 and one of the LUTs 42 are provided or used within conversion circuitry 22 to implement a single conversion of the initial temperature output into a single converted temperature output. In other embodiments, plural multiplexers 40-40n and LUTs 42-42n are used to simultaneously implement a plurality of different conversions of the initial temperature output into a plurality of different converted temperature outputs, for example, as determined by programming.

The outputs of the LUTs 42-42n individually include the converted temperature information in a plurality of digital values which are utilized by different portions (e.g., blocks) of memory circuitry to implement operations with respect to data storage. In addition, the portions of memory circuitry may have different temperature compensation requirements and the LUTs 42-42n provide the digital values tailored to the temperature compensation requirements of the respective circuit portions in one embodiment. The digital values of the different converted temperature outputs may be indicative of the temperature of the memory system 10 within a plurality of different temperature ranges and resolutions according to the LUTs 42-42n of transformation circuitry 28 in one embodiment.

LUTs 42-42n may be pre-programmed in one embodiment and the use of the LUTs 42-42n implements pre-programmed conversions of the initial temperature information to one or more converted temperature outputs including different converted temperature information in one embodiment. The digital values outputted from LUTs 42-42 may be referred to as Data1<L1:0>−Datan<L2-:0>, respectively.

In the illustrated example embodiment, the different portions of the memory circuitry 24 include digital-to-analog converters (DACs) 44-44n which convert the received digital values of the converted temperature information into respective different analog temperature dependent voltage outputs 1-N corresponding to the temperature compensation requirements associated with the DACs 44-44n in the illustrated embodiment. The outputted digital values of the LUTs 42-42n are tailored to provide the different conversions to different temperature ranges and resolutions according to the different temperature compensation requirements of the respective DACs 44-44n in one embodiment.

Controller 12 is configured to control the conversion operations implemented by conversion circuitry 22 in one embodiment. For example, the controller 12 may include one or more groups of resolution select fuse bits <S1:0>−<Sn:0> which may be programmed and applied via respective buses 41-41n to the multiplexers 40-40n. The programming of the groups of resolution select bits control different conversions of the initial temperature information to different converted temperature information according to different sets of temperature parameters in one embodiment. For example, the different conversions convert the temperature information into different temperature ranges and resolutions in one embodiment. In one embodiment, the resolution select fuse bits may be programmed after fabrication of the memory system 10.

The resolution select bits program the multiplexers 40-40n to select different groups of bits of bus 38 which are received from temperature sensor circuitry 20 to generate the different converted temperature outputs in one embodiment. For example, the selection of different groups of bits of bus 38 results in temperature information being provided within different temperature ranges and resolutions. In one embodiment described below, the multiplexers 40-40n reduce or clip the maximum temperature of the temperature range differently by selection of different groups of bits of bus enabling the provision of temperature information within different temperature ranges. In addition, the selection of different groups of bits of bus 38 enables provision of temperature information having different temperature resolutions.

The different groups of bits selected by the different multiplexers 40-40n are used to address the respective LUTs 42-42n in one embodiment. The LUTs 42-42n operate to output respective digital values as a result of the addressing and which provide the respective converted temperature outputs for use by the respective temperature compensation circuits of the memory circuitry 24 in the form of respective DACs 44-44n in the illustrated embodiment. Other example temperature compensated circuitry includes voltage regulators and analog-to-digital converters. The analog voltage outputs 1-N of DACs 44-44n may be simultaneously generated and provided to different portions of memory circuitry of the memory device.

Additional details regarding conversions to different temperature ranges and resolutions are described below in one embodiment. An example temperature range of temperature sensor circuitry 20 may be represented by Tmax−Tmin which may be as wide as possible in one embodiment (e.g., −80° C. to 240° C.) as mentioned above. The resolution of temperature sensor 30 may be referred to as Rtsense and which is equal to $(Tmax-Tmin)/2^{\wedge}(N+1)$ (e.g. $(240-(-80))/2^{\wedge}(5+1)=5$ C/bit for 6 bits). The output of ADC 32 upon bus 33 is TempADC<N:0> as mentioned above and is equal to 0 at Temperature=Tmin (e.g., Tmin=−80° C.).

The minimum temperature at which Temp Out<N:0>=0 is equal to Trimmed Tmin=Tmin+Rtsense*Binary(Tmin Fuse bits<M:0>). For example, when Binary(Tmin Fuse bits<M:0>)=16,Tmin=−80° C., Rtsense=5° C./bit and Trimmed Tmin=0° C.

The following Table A describes the various inputs (i.e., the initial temperature information in different groups of Temp Out bits upon the output bus 38) provided to multiplexers 40-40n as determined by the resolution select fuse bits and the different respective temperature ranges and resolutions of the different converted temperature outputs of LUTs 42-42n resulting therefrom. The converted temperature outputs of LUTs 42-42n are indicative of the temperature of the memory system at a plurality of respective different ranges and/or resolutions. In one implementation, the outputs of LUTs 42-42n are applied to DACs 44-44n which generate the analog voltage outputs 1-N.

TABLE A

| Mux Input | Temperature Range | Temperature Resolution/Bit | Mux Output (Temp Final<N-K:0>) |
|---|---|---|---|
| Temp Out<N:K> | Tmax, Trimmed Tmin | Rtsense * $2^K$ | Temp Out<N:K> |
| Temp Out<N-1:K-1> | Tmax/2, Trimmed Tmin | Rtsense * $2^{(K-1)}$ | If Temp Out <N>=1, All 1 Else = Temp Out <N-1:K-1> |
| Temp Out<N-2:K-2> | Tmax/4, Trimmed Tmin | Rtsense * $2^{(K-2)}$ | If OR (Temp Out <N:N-1>)=1, All 1 Else = Temp Out <N-2:K-2> |
| — | — | — | |
| Temp Out<N-K:0> | Tmax/$2^K$, Trimmed Tmin | Rtsense | If OR (Temp Out <N:N-K+1>) = 1, All 1 Else = Temp Out <N-K:0> |

As previously mentioned, some operations of memory systems 10 which utilize semiconductive materials for data storage may be affected by changes in temperature. For example, cell behavior including current passing through an individual cell for data writing or reading operations may vary as a result of changes in temperature of the memory system. In addition, the variance may be unacceptable if not compensated for, and accordingly, one or more portions of the memory circuitry may be temperature compensated circuitry (e.g., DACs 44-44n) which change operation based upon information regarding the temperature. In an additional example, different circuitry of a given individual memory system may have different temperature information requirements and at least some embodiments described herein provide temperature information of different parameters such as range and resolution to the different circuitry. In addition, behavior of memory cells may change with material advancements and it may be beneficial to have flexibility to adjust temperature parameters such as resolution for characterization and technology evaluation of the cells.

CONCLUSION

In some embodiments, a memory device comprises memory circuitry configured to store data in a plurality of different data states, temperature sensor circuitry configured to sense a temperature of the memory device and to generate an initial temperature output which is indicative of the temperature of the memory device, and conversion circuitry coupled with the temperature sensor circuitry and configured to convert the initial temperature output into a converted temperature output which is indicative of the temperature of the memory device at a selected one of a plurality of possible different temperature resolutions, and wherein the converted temperature output is utilized by the memory circuitry to implement at least one operation with respect to storage of the data.

In some embodiments, a memory device comprises temperature sensor circuitry configured to sense a temperature of the memory device and to generate an initial temperature output which is indicative of the temperature of the memory device, conversion circuitry coupled with the temperature sensor circuitry and configured to convert the initial temperature output to converted temperature information which is indicative of the temperature of the memory device at a plurality of different temperature resolutions, and memory circuitry coupled with the conversion circuitry and configured to store data in a plurality of different data states, wherein a first portion of the memory circuitry is configured to use the converted temperature information having a first of the different temperature resolutions to perform an operation with respect to the storage of the data, and a second portion of the memory circuitry is configured to use the converted temperature information having a second of the different temperature resolutions to perform an operation with respect to the storage of the data.

In some embodiments, a memory device comprises memory circuitry configured to store data in a plurality of different data states, temperature sensor circuitry configured to generate an initial temperature output which is indicative of a temperature of the memory device sensed at the temperature sensor circuitry of the memory device, the initial temperature output comprising a plurality of bits, selection circuitry coupled with the temperature sensor circuitry and configured to select one of a plurality of different groups of the bits, and transformation circuitry coupled with the selection circuitry and configured to transform the selected one group of bits into a converted temperature output which is used by the memory circuitry to implement at least one operation with respect to the storage of the data.

In some embodiments, a memory device operational method comprises sensing a temperature of a memory device using temperature sensor circuitry, the memory device configured to store data in a plurality of different data states, generating an initial temperature output which is indicative of the sensed temperature within a first temperature range, converting the initial temperature output to a converted temperature output which is indicative of the temperature of the memory device within a selected one of a plurality of different temperature resolutions, and using the converted temperature output, implementing at least one operation with respect to the storage of the data.

In some embodiments, a memory device implementation method comprises fabricating a memory device comprising temperature circuitry which is configured to sense a temperature of the memory device and to provide an initial temperature output indicative of the temperature of the memory device within a first temperature range, identifying an application of use of the memory device which is within a second temperature range which is different than the first temperature range, and configuring the temperature circuitry to provide a converted temperature output indicative of the temperature of the memory device within the second temperature range.

In some embodiments, a memory device implementation method comprises identifying different portions of memory circuitry of a memory device which have different temperature compensation requirements, and configuring temperature circuitry, which is configured to sense a temperature of the memory device, to provide temperature information which is indicative of the temperature of the memory device at a plurality of different temperature resolutions and which is to be used by the different portions of the memory circuitry of the memory device to implement operations with respect to storage of data using the memory device.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A memory device comprising:
    memory circuitry configured to store data in a plurality of different data states;
    temperature sensor circuitry configured to sense a temperature of the memory device and to generate an initial temperature output which is indicative of the temperature of the memory device;
    conversion circuitry coupled with the temperature sensor circuitry and configured to convert the initial temperature output into a converted temperature output which is indicative of the temperature of the memory device at a selected one of a plurality of possible different temperature resolutions, and wherein the converted temperature output is utilized by the memory circuitry to implement at least one operation with respect to storage of the data; and
    wherein the converted temperature output is a first converted temperature output, and the conversion circuitry is configured to convert the initial temperature output into a second converted temperature output which is indicative of the temperature of the memory device at a selected other of the possible different temperature resolutions.

2. The device of claim 1 wherein the converted temperature output is indicative of the temperature of the memory device within a selected one of a plurality of possible different temperature ranges.

3. The device of claim 1 wherein the conversion circuitry is configured to simultaneously convert the initial temperature output into the first and second converted temperature outputs.

4. The device of claim 1 wherein the first converted temperature output has increased temperature resolution compared with the second converted temperature output and the second converted temperature output is indicative of the temperature of the memory device within an increased range compared with the first converted temperature output.

5. The device of claim 1 wherein the first and second converted temperature outputs are used by different portions of the memory circuitry having different temperature compensation requirements to individually implement at least one operation with respect to the storage of data using the different portions of the memory circuitry.

6. The device of claim 5 wherein the different portions of the memory circuitry comprise digital-to-analog converters which generate different temperature dependent voltage outputs.

7. The device of claim 1 wherein the conversion circuitry is configured to be programmed to convert the initial temperature output into the converted temperature output which is indicative of the temperature of the memory device at the selected one temperature resolution after the memory device has been fabricated.

8. A memory device comprising:
    temperature sensor circuitry configured to sense a temperature of the memory device and to generate an initial temperature output which is indicative of the temperature of the memory device;
    conversion circuitry coupled with the temperature sensor circuitry and configured to convert the initial temperature output to converted temperature information which is indicative of the temperature of the memory device at a plurality of different temperature resolutions; and
    memory circuitry coupled with the conversion circuitry and configured to store data in a plurality of different data states, wherein a first portion of the memory circuitry is configured to use the converted temperature information having a first of the different temperature resolutions to perform an operation with respect to the storage of the data, and a second portion of the memory circuitry is configured to use the converted temperature information having a second of the different temperature resolutions to perform another operation with respect to the storage of the data.

9. The device of claim 8 wherein the converted temperature information having the first temperature resolution is indicative of temperature of the memory device within an increased temperature range compared with the converted temperature information having the second temperature resolution.

10. The device of claim 8 wherein the temperature sensor circuitry is configured to be programmed differently to provide the initial temperature output having a lowest value at one of a plurality of different temperatures which corresponds to a minimum temperature of a temperature range to be sensed.

11. A memory device comprising:
    memory circuitry configured to store data in a plurality of different data states;
    temperature sensor circuitry configured to generate an initial temperature output which is indicative of a temperature of the memory device sensed at the temperature sensor circuitry of the memory device, the initial temperature output comprising a plurality of bits;
    selection circuitry coupled with the temperature sensor circuitry and configured to select one of a plurality of different groups of the bits; and
    transformation circuitry coupled with the selection circuitry and configured to transform the selected one group of bits into a converted temperature output which is used by the memory circuitry to implement at least one operation with respect to the storage of the data.

12. The device of claim 11 wherein the converted temperature output is a first converted temperature output, and the transformation circuitry is configured to transform another group of the bits into a second converted temperature output.

13. The device of claim 11 wherein the transformation circuitry is configured to provide the converted temperature output according to one set of different temperature parameters as a result of the selection of the one group of bits.

14. The device of claim 11 wherein the converted temperature output is a first converted temperature output and the selection circuitry is configured to select another of the groups of the bits, and the transformation circuitry is configured to transform the selected another group of bits into a second converted temperature output which is used by the memory circuitry to implement at least one operation with respect to the storage of the data.

15. The device of claim 14 wherein the first and second converted temperature outputs are indicative of the temperature of the memory device at a plurality of different temperature resolutions.

16. The device of claim 14 wherein the first and second converted temperature outputs are indicative of the temperature of the memory device at a plurality of different temperature ranges.

17. The device of claim 11 wherein a plurality of control bits are programmed after fabrication of the memory device to control the selection of the one group of bits.

18. A memory device operational method comprising:
sensing a temperature of a memory device using temperature sensor circuitry, the memory device configured to store data in a plurality of different data states;
generating an initial temperature output which is indicative of the sensed temperature of the memory device;
converting the initial temperature output to a converted temperature output which is indicative of the temperature of the memory device at a selected one of a plurality of different temperature resolutions;
using the converted temperature output, implementing at least one operation with respect to the storage of the data; and
wherein the converted temperature output comprises a first converted temperature output, and further comprising converting the initial temperature output to a second converted temperature output which is indicative of the temperature of the memory device at a selected other of the different temperature resolutions, and implementing another operation with respect to the storage of the data using the second converted temperature output.

19. The method of claim 18 wherein the first and second converted temperature outputs are indicative of the temperature of the memory device within different temperature ranges.

20. The method of claim 18 further comprising selecting the one temperature resolution after fabrication of the memory device.

21. The method of claim 18 wherein the converting comprises converting using conversion circuitry, and further comprising programming the conversion circuitry to implement the converting of the initial temperature output to the selected one of the different temperature resolutions after fabrication of the memory device.

22. The method of claim 18 wherein the converting comprises converting using conversion circuitry, and further comprising configuring the conversion circuitry to implement the converting of the initial temperature output to the converted temperature output corresponding to an application of use of the memory device.

23. The method of claim 18 further comprising, using the first and second converted temperature outputs, providing different temperature dependent voltage signals to different portions of the memory circuitry.

24. A memory device implementation method comprising:
fabricating a memory device comprising temperature circuitry which is configured to sense a temperature of the memory device and to provide an initial temperature output which is indicative of the temperature of the memory device within a first temperature range;
identifying an application of use of the memory device which is within a second temperature range which is different than the first temperature range; and
configuring the temperature circuitry to convert the initial temperature output into a converted temperature output indicative of the temperature of the memory device within the second temperature range during use of the memory device.

25. The method of claim 24 wherein the configuring comprises configuring after the fabricating the memory device.

26. The method of claim 24 wherein the configuring comprises programming a plurality of control bits.

27. The method of claim 24 wherein the first temperature range is greater than the second temperature range.

28. The method of claim 24 wherein the configuring comprises selecting one of a plurality of predefined conversions of the initial temperature output to the converted temperature output.

29. The method of claim 24 wherein the converted temperature output is a first converted temperature output, and further comprising:
configuring the temperature circuitry to convert the initial temperature output into a second converted temperature output indicative of the temperature of the memory device within a third temperature range which is different than the first and second temperature ranges.

30. The method of claim 29 wherein different portions of the memory circuitry use the converted temperature output in the second and third temperature ranges.

31. A memory device implementation method comprising:
identifying different portions of memory circuitry of a memory device which have different temperature compensation requirements; and
configuring temperature circuitry, which is configured to sense a temperature of the memory device, to provide temperature information which is indicative of the temperature of the memory device at a plurality of different temperature resolutions and which is to be used by the different portions of the memory circuitry of the memory device to implement operations with respect to storage of data using the memory device.

32. The method of claim 31 wherein the configuring comprises configuring the temperature circuitry to provide the temperature information within a plurality of different temperature ranges.

33. The method of claim 31 further comprising configuring the temperature circuitry to generate a lowest value corresponding to a lowest temperature to be sensed.

34. A memory device comprising:
memory circuitry configured to store data in a plurality of different data states;
temperature sensor circuitry configured to sense a temperature of the memory device and to generate an initial temperature output which is indicative of the temperature of the memory device;
conversion circuitry coupled with the temperature sensor circuitry and configured to convert the initial temperature output into a converted temperature output which is indicative of the temperature of the memory device at a selected one of a plurality of possible different temperature resolutions, and wherein the converted temperature output is utilized by the memory circuitry to implement at least one operation with respect to storage of the data; and
wherein the conversion circuitry is configured to be programmed to convert the initial temperature output into the converted temperature output which is indicative of the temperature of the memory device at the selected one temperature resolution after the memory device has been fabricated.

35. A memory device operational method comprising:
- sensing a temperature of a memory device using temperature sensor circuitry, the memory device configured to store data in a plurality of different data states;
- generating an initial temperature output which is indicative of the sensed temperature of the memory device;
- converting the initial temperature output to a converted temperature output which is indicative of the temperature of the memory device within a selected one of a plurality of different temperature resolutions;
- using the converted temperature output, implementing at least one operation with respect to the storage of the data; and
- wherein the converting comprises converting using conversion circuitry, and further comprising programming the conversion circuitry to implement the converting of the initial temperature output to the selected one of the different temperature resolutions after fabrication of the memory device.

36. A memory device operational method comprising:
- sensing a temperature of a memory device using temperature sensor circuitry, the memory device configured to store data in a plurality of different data states;
- generating an initial temperature output which is indicative of the sensed temperature of the memory device;
- converting the initial temperature output to a converted temperature output which is indicative of the temperature of the memory device within a selected one of a plurality of different temperature resolutions;
- using the converted temperature output, implementing at least one operation with respect to the storage of the data; and
- wherein the converting comprises converting using conversion circuitry, and further comprising configuring the conversion circuitry to implement the converting of the initial temperature output to the converted temperature output corresponding to an application of use of the memory device.

* * * * *